(12) United States Patent
Long

(10) Patent No.: US 11,187,676 B2
(45) Date of Patent: Nov. 30, 2021

(54) DEVICE AND METHOD FOR DETERMINING THE CONCENTRATION OF A VAPOR

(71) Applicant: AIXTRON SE, Herzogenrath (DE)

(72) Inventor: Michael Long, Herzogenrath-Kohlscheid (DE)

(73) Assignee: AIXTRON SE, Herzogenrath (DE)

( * ) Notice: Subject to any disclaimer, the term of this patent is extended or adjusted under 35 U.S.C. 154(b) by 112 days.

(21) Appl. No.: 16/499,791

(22) PCT Filed: Mar. 22, 2018

(86) PCT No.: PCT/EP2018/057229
§ 371 (c)(1),
(2) Date: Sep. 30, 2019

(87) PCT Pub. No.: WO2018/177853
PCT Pub. Date: Oct. 4, 2018

(65) Prior Publication Data
US 2020/0033295 A1 Jan. 30, 2020

(30) Foreign Application Priority Data
Mar. 31, 2017 (DE) .................. 10 2017 106 968.2

(51) Int. Cl.
*G01N 29/036* (2006.01)
*C23C 14/12* (2006.01)
*C23C 14/54* (2006.01)

(52) U.S. Cl.
CPC ........... *G01N 29/036* (2013.01); *C23C 14/12* (2013.01); *C23C 14/544* (2013.01);
(Continued)

(58) Field of Classification Search
CPC ..... C23C 14/12; C23C 14/544; C23C 16/455; G01N 2291/014; G01N 2291/0256;
(Continued)

(56) References Cited

U.S. PATENT DOCUMENTS 5,567,267 A * 10/1996 Kazama ............... H01J 37/32
156/345.27
5,892,207 A * 4/1999 Kawamura ............ C23C 16/46
219/492

(Continued)

FOREIGN PATENT DOCUMENTS

DE 10 2015 104 240 A1 9/2016
JP S58 223009 A 12/1983
(Continued)

OTHER PUBLICATIONS

International Search Report dated Jun. 13, 2018, from the ISA/European Patent Office, for International Patent Application No. PCT/EP2018/057229 (filed Mar. 22, 2018), 5 pages.
(Continued)

*Primary Examiner* — Francis C Gray
(74) *Attorney, Agent, or Firm* — Ascenda Law Group, PC

(57) ABSTRACT

A device for determining the partial pressure or concentration of a vapor in a volume includes a sensor element that can be caused to oscillate and temperature-controlled to a temperature below the condensation temperature of the vapor. The sensor element has an oscillation frequency that is influenced by a mass accumulation formed by condensed vapor on the sensor surface thereof. The rear side of the sensor element pointing away from the sensor surface contacts a thermal transfer surface of a thermal transfer element. The thermal transfer element is formed from an electrically heatable heating element that is connected to a cooling element in a thermally conductive manner by a thermal dissipation surface, which is different from the thermal
(Continued)

transfer surface. The thermal transfer surface extends substantially parallel to the thermal dissipation surface.

10 Claims, 2 Drawing Sheets

(52) U.S. Cl.
CPC .................. *G01N 2291/014* (2013.01); *G01N 2291/0256* (2013.01); *G01N 2291/02809* (2013.01)

(58) Field of Classification Search
CPC .......... G01N 2291/02809; G01N 2291/02845; G01N 29/036
See application file for complete search history.

(56) References Cited

U.S. PATENT DOCUMENTS

| | | | |
|---|---|---|---|
| 6,125,687 A * | 10/2000 | McClelland | G01N 5/00 422/80 |
| 6,295,861 B1 | 2/2001 | Keine | |
| 7,275,436 B2 | 10/2007 | Grimshaw | |
| 7,327,948 B1 * | 2/2008 | Shrinivasan | C23C 16/56 118/724 |
| 2014/0053779 A1 | 2/2014 | Martinson et al. | |
| 2015/0315707 A1 * | 11/2015 | Xue | C23C 16/46 427/534 |
| 2017/0016859 A1 * | 1/2017 | Beccard | G01N 29/036 |

FOREIGN PATENT DOCUMENTS

| | | |
|---|---|---|
| WO | 99/45745 A1 | 9/1999 |
| WO | 2015/128279 A1 | 9/2015 |

OTHER PUBLICATIONS

Written Opinion dated Jun. 13, 2018, from the ISA/European Patent Office, for International Patent Application No. PCT/EP2018/057229 (filed Mar. 22, 2018), 6 pages.
International Search Report dated Jun. 12, 2018, from the ISA/European Patent Office, for International Patent Application No. PCT/EP2018/057227 (filed Mar. 22, 2018), 5 pages.
Written Opinion dated Jun. 12, 2018, from the ISA/European Patent Office, for International Patent Application No. PCT/EP2018/057227 (filed Mar. 22, 2018), 8 pages.
Preliminary Amendment filed Sep. 27, 2019, for U.S. Appl. No. 16/499,211, (filed Sep. 27, 2019), 8 pages.
International Preliminary Report on Patentability dated Oct. 1, 2019, from The International Bureau of WIPO, for International Patent Application No. PCT/EP2018/057229 (filed Mar. 22, 2018), 14 pages.
Written Opinion dated Jun. 13, 2018, from the ISA/European Patent Office, for International Patent Application No. PCT/EP2018/057229 (filed Mar. 22, 2018), translations, 6 pages.
International Preliminary Report on Patentability dated Oct. 1, 2019, from The International Bureau of WIPO, for International Patent Application No. PCT/EP2018/057227 (filed Mar. 22, 2018), 17 pages.
Written Opinion dated Jun. 12, 2018, from the ISA/European Patent Office, for International Patent Application No. PCT/EP2018/057227 (filed Mar. 22, 2018), translations, 7 pages.
Office Action dated May 19, 2021, for Application No. CN 201880029467.5 (filed Mar. 22, 2018), 17 pgs.

* cited by examiner

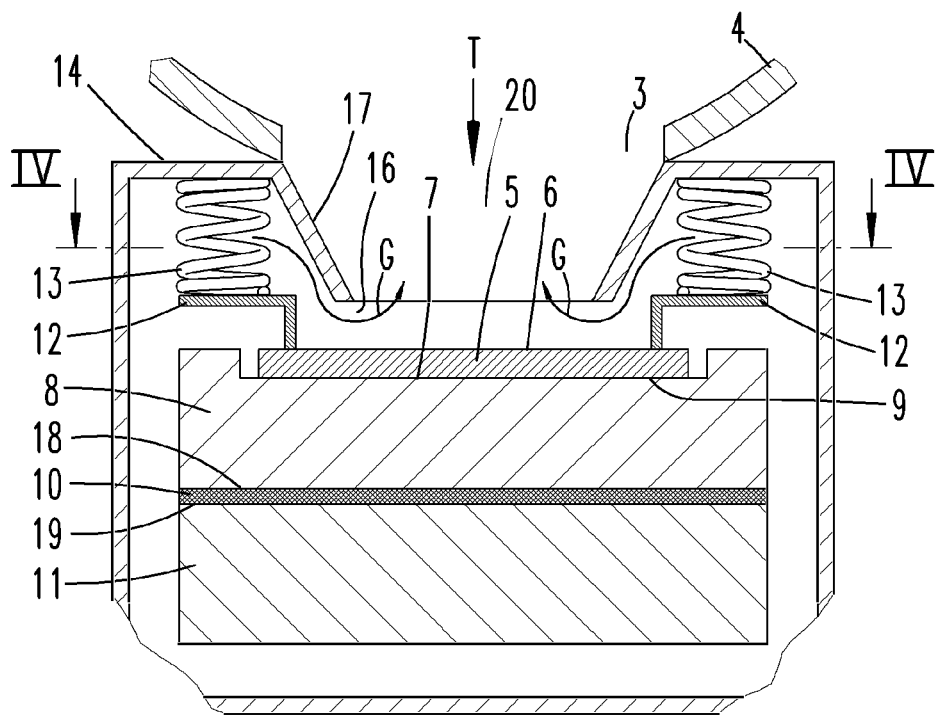
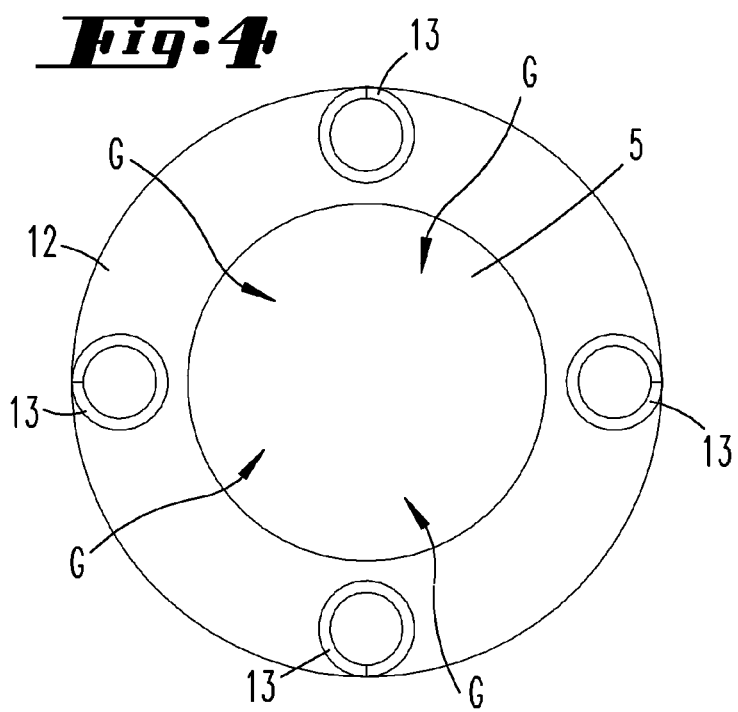

DEVICE AND METHOD FOR DETERMINING THE CONCENTRATION OF A VAPOR

RELATED APPLICATIONS

This application is a National Stage under 35 USC 371 of and claims priority to International Application No. PCT/EP2018/057229, filed 22 Mar. 2018, which claims the priority benefit of DE Application No. 10 2017 106 968.2, filed 31 Mar. 2017.

FIELD OF THE INVENTION

The invention relates to a device for determining the partial pressure or concentration of a vapor in a volume having a sensor element, which can be caused to oscillate and temperature-controlled to a temperature below the condensation temperature of the vapor, and which has an oscillation frequency that is influenced by a mass accumulation formed by condensed vapor on its sensor surface, wherein the rear side of the sensor element facing away from the sensor surface abuts against a thermal transfer surface of a thermal transfer element.

The invention further relates to a method for determining the partial pressure or concentration of a vapor in a volume, wherein the vapor is transported in a transport direction to a sensor surface of a sensor element, which is temperature-controlled to a temperature below the condensation temperature of the vapor, so that the vapor condenses as a mass accumulation that influences an oscillation frequency of the sensor element on the sensor surface, for which purpose heat is extracted from the sensor element through a thermal transfer element by means of a cooling element.

BACKGROUND

WO 2015/128279 A1 describes a device and method for determining the concentration of a vapor by means of QCM (Quartz Crystal Microbalance). QCM is to be used to determine the vapor concentration or partial pressure of a vapor in an inert gas flow.

DE 10 2015 104 240 A1 describes a similar device. It is there provided that the QCM be heated from its rear side, so as to bring the sensor surface to a temperature at which the mass accumulation of the condensed vapor evaporates.

US 2014/0053779 A1 describes the use of a QCM, wherein a gas flow can be fed into the sensor housing in the back of the sensor element.

When using a QCM in a coating device for determining a layer thickness of a layer deposited onto a substrate, the sensor element has a good thermal contact with the environment, and is thermally insulated with respect to a carrier of the sensor element.

SUMMARY OF THE INVENTION

The vapor concentration or partial pressure of the vapor in a volume is determined with a generic sensor element by having its oscillation frequency be influenced by a mass accumulation generated by the condensation of the vapor on the surface of the sensor element. The resonance frequency of the sensor element drifts away from an initial value as the mass accumulation increases, wherein the change in frequency per unit of time is a measure for the vapor concentration in the volume. The growth in mass on the sensor surface of the sensor element over time is further influenced by the transport properties, in particular by the diffusion property of the gas phase of the volume, as well as by the length of a vapor transport channel between a window to the volume and the sensor surface of the oscillating sensor element.

The service life of such a sensor element is limited by a maximum mass accumulation reached on the sensor surface. Once this maximum mass accumulation has been reached, either the sensor element has to be replaced or the sensor element must be heated for cleaning purposes. To this end, the sensor element is heated to a temperature lying above the condensation temperature of the vapor, so that the condensate is sublimated from the sensor surface.

The object of the invention is to improve the method described at the outset and the device described at the outset from a procedural standpoint, in particular to reduce the cleaning cycle time.

The object is achieved by the invention indicated in the claims, wherein each claim, and each subclaim, represents an independent solution to the object, and the individual claims can be combined with each other as desired, wherein the combination of individual claim features is also provided.

While the devices used to date require that a high thermal mass be heated for cleaning the sensor surface and that this high thermal mass also be cooled again, thereby giving rise to cleaning times of 90 minutes or more, the invention proposes means with which the cleaning times can be reduced.

It is initially and essentially proposed that the sensor element has a sensor surface that faces the volume, on which the vapor transported from the volume to the sensor element through a vapor transport channel can condense into a mass accumulation. To this end, the sensor surface and in particular also the entire sensor element must be cooled to a temperature lying below the condensation temperature of the vapor. The volume, which is preferably a gas transport channel through which an organic vapor is transported with an inert gas, is kept at a temperature above the condensation temperature of the vapor, wherein this temperature can measure 350° C., for example. By contrast, the surface temperature of the sensor element is to measure 220° C. In order to achieve this, the rear side of the sensor element lying opposite the sensor surface rests upon a thermal transfer surface of a heat conductor, which transports the heat from the sensor element to a cooling element, which dissipates the heat. According to the invention, the thermal transfer element is formed between the thermal transfer surface and a thermal dissipation surface by a heating element, with which the sensor element can be heated in such a way that the sensor surface reaches a temperature at which the condensate accumulated thereon can sublimate. To this end, the temperature preferably reaches at least 350° C. In order to accelerate the process of heating the sensor element, an insulation element can be arranged between the heating element and cooling element, which has a lower thermal conductivity than the thermal transfer element formed by the heating element. The heating element can be an electrically heatable element. It can have a heating resistor through which an electrical heating current flows so as to heat the heating element to the evaporation temperature at which the mass accumulation can be evaporated. The insulation effect exerted by the insulation element is preferably such that the heating rate or cooling rate lies at about 3° C./s. The insulation element forms a heat flow resistor, and is preferably designed in such a way that a temperature difference of at least 160° C. can form between a thermal dissipation surface of the heating element and a cooling surface of the cooling element while the cooling element is performing a cooling function and the heating element is simultaneously performing a heating function, during which the sensor element is heated to a temperature above the evaporation temperature of the condensate. Upon conclusion of the cleaning step, in which the evaporated condensate is transported with a gas flow through the vapor transport channel and into the volume, and once the heating of the heating element is ended, heat is extracted from the heating element through the insulation element by the cooling element, so that it can cool to the operating temperature at which the sensor surface can condense vapor. The thickness of the insulation element or its thermal conductivity is selected in such a way that the heating times for cleaning are not too long, while the cooling times after the cleaning step are also not too long. It is sufficient if the aforementioned temperature difference of 160° C. be achieved at an 80% thermal output of the heating element. Because the sensor element carrier is configured according to the invention as a heating element through which heat can be transferred from the sensor element to the cooling element, the cleaning cycles can be shortened to times of between 2 and 3 minutes. The gas flow guided from the edge of the sensor surface over the sensor surface likewise accelerates the cleaning process by transporting the evaporated vapor to the volume.

Another aspect of the invention involves thermally decoupling the sensor element from the wall of the volume or a pipe socket connected with the wall in a thermally conductive manner. The wall of the volume can thus be heated without the supply of heat to the wall resulting in an increased temperature of the sensor element. According to the invention, a thermal insulation element is provided between the edge of the sensor element and a housing part connected with the wall of the volume in a thermally conductive manner. This thermally insulating element can be a spring, in particular a compression spring. Due to this configuration, the sensor surface can have a temperature that is at least 100° C. lower than the temperature of the volume wall.

It is further proposed that means be provided for generating a gas flow, in particular an inert gas flow, which is directed opposite the vapor transport direction to the sensor surface. The vapor is transported from the volume toward the sensor surface essentially via diffusion, in particular diffusion through a vapor transport channel. The gas flow according to the invention is directed opposite the transport direction, e.g., the diffusion direction. Suitable flow-generating means are to be used to make the gas flow from the sensor surface in the direction of a window, through which the vapor can enter into the vapor transport channel. A "tooling factor" can be prescribed by suitably selecting the volume flow or mass flow of the gas flow that flows through the vapor transport channel opposite the transport direction. The condensation rate of the vapor on the sensor surface can be lowered by selecting a suitable gas flow. Because the gas flow in the vapor transport channel is directed opposite the diffusion, the maximum mass accumulation on the sensor surface is only reached after a longer operating period. In a preferred embodiment of the invention, the gas flow, which can also be referred to as the flushing gas flow, is injected in direct proximity to the sensor surface of the sensor element. In a preferred embodiment, the window to the volume is adjoined by a vapor transport channel, which is completely enclosed by a wall. This wall can preferably be a pipe socket or a funnel-shaped apron. This wall extends directly to the sensor surface, wherein the sensor surface can run parallel to the surface of the window. A peripheral edge of the wall can be spaced apart from the surface of the sensor element. However, the peripheral edge can also be spaced apart from a bracket that envelops the sensor element. The resultant gap forms a flat nozzle, through which the gas flow enters in a direction parallel to the sensor surface. A gas flow preferably forms from the edge of the sensor surface in the direction toward the center of the sensor surface. The flat nozzle is preferably a flat ring nozzle. The sensor element preferably lies on a carrier, which is arranged in a sensor housing. The sensor housing has a gas feed line, through which the gas can be fed into the sensor housing. A gas flow can flow through a gas line forming the volume, with which an organic vapor is transported. The volume and in particular the heated gas line designed as a pipe has a window. This window has an opening through which the vapor can diffuse. The window is preferably adjoined by the pipe socket, which forms a diffusion path. The pipe socket has a free edge that is spaced apart from the sensor surface. A gap forms as a result. The gap forms a wide slit nozzle, which can have the shape of a ring channel. The gas flow that flows into the pipe socket through this ring channel generates a flow directed opposite the diffusion, so that the average transport speed of the vapor from the window to the sensor surface can be adjusted by setting the flow rate. During the adjustment, the flow through the pipe socket is set in such a way that the growth in mass on the sensor surface over time is large enough to receive a high enough signal-to-noise ratio.

In a coating system also encompassed by the inventive idea, which has a process chamber into which vapor is fed by means of a gas inlet unit, a sensor array according to the invention can be arranged both in the vapor feed line and in the process chamber or at the edge of the process chamber. The vapor transported through the gas feed line is repeatedly diluted on its way from the evaporator to the process chamber or to the gas inlet unit, so that a partial vapor difference of 5:1 can arise between the vapor generator and process chamber. As a result of feeding gas into the pipe socket, a structurally identical partial pressure sensor can be used in both the vapor feed line and in the process chamber. This gas flow, which comprises a "tooling gas flow", can be used to set the sensitivity of the sensor by a factor greater than 10. This is significant in particular if several gas feed lines are provided on a coating device for feeding in different vapors, wherein a vapor represents a dopant that is fed into the process chamber only with a very low partial pressure. In order to measure a dopant vapor, the device can preferably be used without any supplementary gas injection.

The sensor element is preferably comprised of a QCM (Quartz Crystal Monitor), which is an oscillating element formed by a crystal. The oscillating element can preferably consist of $GaPO_4$. The sensor array is preferably used to determine the vapor of an organic precursor, which is transported through a gas line comprising the volume by means of an inert gas flow. The vapor is transported to a gas inlet unit of a coating system in which OLED components, e.g., screens and the like, are manufactured. In particular, the sensor array is part of a control circuit, with which a chronologically constant vapor flow rate is guided in the process chamber of an OLED coating device. The volume can consist of a deposition chamber, whose walls have a temperature that is lower than the condensation temperature of the gas, wherein such a volume does not carry a flow, and preferably also has no inert gas atmosphere, but instead essentially only a vapor source, for example an evaporator for generating the vapor, and a substrate upon which the vapor is to condense. However, the volume is preferably comprised of a vapor transport line in the form of a heated pipeline, through which a vapor generated by a vapor generator is transported by means of a carrier gas. The walls of the vapor transport line have a temperature greater than the condensation temperature of the vapor. Quartz can be used as the material for the sensor element. However, use is preferably made of a material that can be utilized as an oscillating element at above 50° C., and preferably at far above 50° C. When operating the sensor element on a vapor transport line, the condensation rate of the vapor on the sensor surface is about 5 times higher than when using the sensor element on or in a volume in which a vapor is generated without the formation of a flow, i.e., in a deposition chamber, as mentioned above. During the preferred use of the sensor element on a vapor transport line carrying a flow of vapor, the used sensors must be about five times more sensitive. The measures according to the invention are aimed at satisfying these requirements. The sensor element has a longer service life, even though a higher deposition rate is to be expected when operating the sensor on a vapor transport line.

In a known QCM, with which the layer thickness of a layer deposited on a substrate is determined by changing the oscillating frequency, there is a poor thermally conductive connection between the sensor element and a sensor element carrier. In contrast, there is a good thermally conductive connection with the environment, i.e., with the vapor or a carrier gas. If the sensor element carrier in this array is cooled, a disadvantageous condensation can take place outside of the sensor surface. According to the invention, a good thermally conductive connection exists between the rear side of the sensor element and the sensor element carrier, which is here a thermal transfer element. The surface of the thermal transfer element can perform the function of an electrical contact. Another electrical contact is achieved via the spring elements. While the spring elements are supported on the rear side of the sensor element in the prior art, the invention involves exposing in particular the edge of the sensor surface to the spring element, so that the rear side of the sensor element abuts against the thermal transfer element with a good thermally conductive connection. This configuration is inverted by comparison to the prior art, and decouples the temperature of the sensor element from the temperature of the environment, i.e., of the vapor or carrier gas.

BRIEF DESCRIPTION OF THE DRAWINGS

The invention will be explained in detail below based upon an exemplary embodiment. Shown on:

FIG. 3 is a magnified view of the cutout III in FIG. 1; and

FIG. 4 is a cross-section along the line IV-IV in FIG. 3.

DETAILED DESCRIPTION

Figure 1:
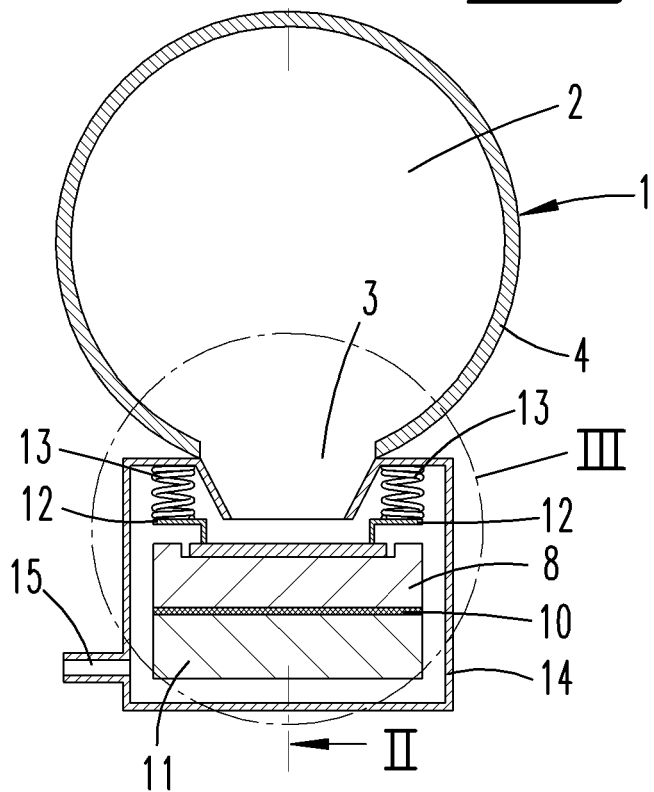
FIG. 1 is a cross-section along the line I-I in FIG. 2 of a gas transport line 1, with which vapor of an organic initial substance is transported from a vapor source to a gas inlet unit of an OLED coating device, wherein the I-I section line lies centrally through a window 3 in the wall 4 of the vapor transport line 1.
Figure 2:
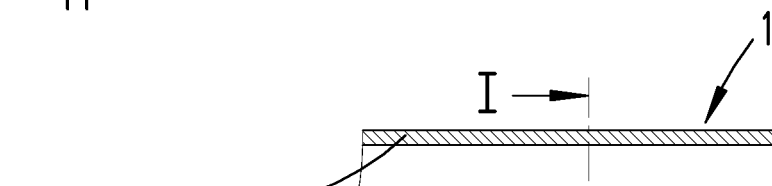
FIG. 2 is a cross-section along the line II-II in FIG. 1.
Figure 2:
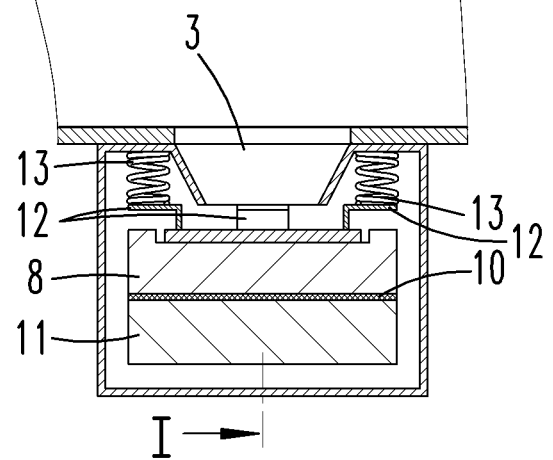

The vapor transport line 1 comprises a volume 2, through which passes the vapor of an organic initial substance transported by the inert gas. The wall 4 of the vapor transport line is temperature-controlled to a temperature above the condensation temperature of the vapor, for example to 350° C.

The volume 2 of the vapor transport line 1 is connected with a sensor surface 6 of a sensor element 5 by a window 3 and a vapor transport channel 20 that adjoins the latter. The diameter of the vapor transport channel 20 roughly corresponds to the diameter of the window 3. In the exemplary embodiment, the vapor transport channel 20 is enveloped by a tubular socket 17, which comprises a funnel-shaped apron, whose side facing away from the window 3 forms a free edge.

The edge of the pipe socket 17 is spaced apart from the sensor surface 6 by a gap. This gap forms an annular flow channel 16, thereby forming a flat nozzle through which a gas flow G can flow.

In particular, the vapor of the organic initial substance contained in the volume 2 is transported through diffusion in a transport direction T through the window 3 and the vapor transport channel 20 to the sensor surface 6 of the sensor element 5. The vapor is here transported against the gas flow G, which flows opposite the transport direction T through the vapor transport channel 20 and the window 3. As a consequence, the mass flow or volume flow of the gas flow G makes it possible to set the transport rate of the vapor in the direction of the transport direction T toward the sensor surface 6.

A cooling element 11 is provided, and connected in a thermally conductive manner with the rear side 7 of the sensor element 5 via a thermal transfer element. The cooling element 11 cools the sensor surface 6 to a temperature of 220° C., for example, wherein the vapor condenses on the sensor surface 6 at this temperature.

The sensor element 5 is comprised of a QCM, which is made to oscillate with suitable means known from prior art. In particular, the QCM is part of an oscillating circuit. The resonance frequency of the QCM is influenced by the mass accumulation of condensed vapor formed on the sensor surface 6. Conclusions as to the vapor concentration or partial pressure of the vapor in the volume 2 can be drawn from the change in the resonance frequency. The mass accumulation rate on the sensor surface 6 can be diminished by increasing the gas flow G. This makes it possible to lengthen the cycle duration of the sensor element 5.

In an aspect of the invention, the thermal transfer element is a heating element 8. The heating element 8 has a thermal transfer surface 9 that contacts the rear side 7 of the sensor element 5 in a thermally conductive manner. A thermal dissipation surface 18, which is different from the thermal transfer surface 9 and in the exemplary embodiment lies opposite the thermal transfer surface 9, is connected in a thermally conductive manner with a cooling surface 19 of the cooling element 11, so that the heating element 8 performs the function of a thermal transfer element when no electrical heat output is fed into the heating element 8.

The exemplary embodiment further provides that an insulation element 10 be arranged between the thermal dissipation surface 18 of the heating element 8 and the cooling surface 19 of the cooling element 11. The insulation element 10 has a lower thermal conductivity than the heating element 8. The thermal conductivity property of the insulation element 10 is selected in such a way that, with the cooling output of the cooling element 11 not turned off, electrical heat output can be fed into the heating element 8 so as to heat the sensor surface 6 to a temperature at which the condensate that accumulated on the sensor surface 6 can sublimate. As a consequence, the thermal transfer surface 9 functions on the one hand to dissipate heat from the sensor element 5 during normal operation, and on the other hand to supply heat to the sensor element 5 during the cleaning operation.

If the supply of heat to the heating element 8 is ended, heat is extracted from the heating element 8 through the insulation element 10. The heating element 8 cools in the process, and also extracts heat from the sensor element 5, so that the sensor surface 6 is brought to a temperature below the condensation temperature of the vapor.

The heating element 8, insulation element 10 and cooling element 11 comprise a sensor element carrier, which is inserted in a housing 14 into which a gas feed line 15 empties, through which the gas flow is injected, and as the flushing gas flow G flows through the annular gap-shaped opening between the edge of the pipe socket 17 enveloping the vapor transport channel 20 and the sensor surface 6 through the vapor transport channel 20. The gas flow G preferably consists of an inert gas. The latter can here be nitrogen, a noble gas or also hydrogen. The gas flow G preferably consists of the same substance that also comprises the carrier gas flow, with which the vapor is transported through the volume 2 formed by a gas line.

A contact element 12 that is shaped like a ring and envelops a central area of the sensor surface 6 is provided. The sensor element 5 is preferably made to oscillate in such a way that the contact line of the contact element runs on a nodal line. The rear side of the sensor element 5 comprises a counter-contact to the contact element 12. The contact element 12 and counter-contact are hooked up to an electronic circuit for executing the oscillation.

Several spring elements 13 are preferably provided, with which the contact element 12 is supported against a hot part of the housing. The spring elements 13 thus provide a thermal transfer resistor that resembles a thermal insulation element, so that the temperature of the sensor element 5 can be set essentially independently of the temperature of the wall 4 of the volume 2 or of the temperature of the pipe socket 17.

The above statements serve to explain the inventions encompassed by the application as a whole, which further develop the prior art at least by the following feature combinations, each even independently, wherein two, several or all of these feature combinations can also be combined, specifically:

A device, characterized in that the heat transfer element is formed by a heating element 8, which is connected in a heat conducting manner with a cooling element 11 by a thermal dissipation surface 18 differing from the thermal transfer surface 9.

A device, characterized in that the heating element 8 is electrically heatable.

A device, characterized in that the heat transfer surface 9 runs essentially parallel to the thermal dissipation surface 18.

A device, characterized in that an insulation element 10 is arranged between the thermal dissipation surface 18 and a cooling surface 19 of the cooling element 11, which has a lower thermal conductivity than the heating element 8, and through which heat can be transported from the heating element 8 to the cooling element 11.

A device, characterized in that the volume 2 is formed by a vapor transport line 1 that can carry a carrier gas that transports the vapor.

A device, characterized in that the sensor surface 6 is thermally separated by means of a thermally insulating element from the wall 4 of the volume 2 or from a pipe socket 17 connected with the wall 4 in a thermally conductive manner.

A device, characterized in that the thermally insulating element is a spring element 13.

A device, characterized in that means are provided to generate a gas flow (G) directed from the sensor surface 6 to the volume 2.

A method, characterized in that the thermal transfer element is operated as a heating element 8 for cleaning the sensor surface 6, wherein electric heat energy is fed into the heating element 8 to bring the surface temperature of the sensor surface 6 to a temperature above the condensation temperature of the vapor.

A method, characterized in that heat is transported through an insulation element 10 to the cooling element 11 while heating the heating element 8.

A method, characterized in that, in particular when cleaning the sensor surface 6, a gas flow directed from the sensor surface 6 toward the volume 2 is generated, with which the condensate evaporated from the sensor surface 6 is transported into the volume 2.

A method, characterized in that the volume 2 is formed by a vapor transport line 1, through which the vapor is transported by means of a carrier gas.

All disclosed features are essential to the invention, whether taken separately or in combination with each other. The disclosure of the application hereby also includes the disclosure content of the accompanying/attached priority documents (copy of preliminary application) in its entirety, including for the purpose of also incorporating features in these documents into the claims of this application. Even without the features of a referenced claim, the features in the subclaims characterize independent inventive further developments of prior art, in particular in order to generate partial applications based upon these claims. The invention also relates to embodiments in which individual features from among those mentioned in the above specification are not realized, in particular to the extent that they are obviously not necessary for the respectively intended application, or can be replaced by other means having an equivalent technical effect.

REFERENCE LIST

1 Vapor transport line
2 Volume
3 Window
4 Wall
5 Sensor element
6 Sensor surface
7 Rear side of sensor element
8 Heating element
9 Thermal transfer surface
10 Insulation element
11 Cooling element
12 Contact element
13 Spring element
14 Housing
15 Gas feed line
16 Flow channel
17 Pipe socket
18 Thermal dissipation surface
19 Cooling surface
20 Vapor transport channel
G Flushing gas flow
T Transport direction

What is claimed is:

1. A device for determining a partial pressure or concentration of a vapor in a volume (2), the device comprising:
 a sensor element (5) that is able to be oscillated, the sensor element (5) having a temperature that is controllable to a temperature below a condensation temperature of the vapor, and an oscillation frequency that is influenced by a mass accumulation formed by the vapor condensing on a sensor surface (6) of the sensor element (5);
 a thermal transfer element with a thermal transfer surface (9) and a thermal dissipation surface (18) differing from the thermal transfer surface (9), wherein a rear side (7) of the sensor element (5) facing away from the sensor surface (6) abuts against the thermal transfer surface (9) of the thermal transfer element, and wherein the thermal transfer element is formed by a heating element (8); and
 a cooling element (11) that is connected to the thermal dissipation surface (18) in a thermally conductive manner, wherein during a cooling operation, heat is extracted from the sensor element (5) through the thermal transfer surface (9), and flows through the heating element (8) to the cooling element (11).

2. The device of claim 1, wherein the heating element (8) is electrically heatable.

3. The device of claim 1, wherein the thermal transfer surface (9) runs parallel to the thermal dissipation surface (18).

4. The device of claim 1, further comprising an insulation element (10) arranged between the thermal dissipation surface (18) of the thermal transfer element and a cooling surface (19) of the cooling element (11), wherein the insulation element (10) has a lower thermal conductivity than the heating element (8), and wherein during the cooling operation, heat is transported from the heating element (8) through the insulation element (10) to the cooling element (11).

5. The device of claim 1, wherein the volume (2) is formed by a vapor transport line (1), through which the vapor is carried by means of a carrier gas.

6. The device of claim 1, wherein the sensor surface (6) is thermally separated by means of a thermally insulating element from one or more of a wall (4) of the volume (2) or a pipe socket (17) connected to the wall (4) in a thermally conductive manner.

7. The device of claim 1, wherein the thermally insulating element is a spring element (13).

8. A method for determining a partial pressure or concentration of a vapor in a volume (2), the method comprising:
 transporting the vapor in a transport direction (T) to a sensor surface (6) of a sensor element (5);
 during a cooling operation:
  controlling a surface temperature of the sensor element (5) to a temperature below a condensation temperature of the vapor by extracting heat from the sensor element (5), the extracted heat flowing from the sensor element (5) to a cooling element (11) through a heating element (8) that is operated as a thermal transfer element during the cooling operation;
  condensing the vapor on the sensor surface (6); and
  as a result of the vapor condensing on the sensor surface (6), forming a mass accumulation on the sensor surface (6), the mass accumulation influencing an oscillation frequency of the sensor element (5); and
 during a cleaning operation, feeding electric heat energy into the heating element (8) so as to bring the surface temperature of the sensor surface (6) to a temperature above the condensation temperature of the vapor.

9. The method of claim 8, wherein during the cleaning operation, heat is transported from the heating element (8) through an insulation element (10) to the cooling element (11).

10. The method of claim 8, wherein the volume (2) is formed by a vapor transport line (1), through which the vapor is transported by means of a carrier gas.

* * * * *